US008759198B2

(12) United States Patent
Sucher et al.

(10) Patent No.: US 8,759,198 B2
(45) Date of Patent: Jun. 24, 2014

(54) ACCELERATED FURNACE RAMP RATES FOR REDUCED SLIP

(75) Inventors: Bradley David Sucher, Murphy, TX (US); Rick L. Wise, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/584,004

(22) Filed: Aug. 13, 2012

(65) Prior Publication Data

US 2014/0045321 A1 Feb. 13, 2014

(51) Int. Cl.
*H01L 21/322* (2006.01)

(52) U.S. Cl.
USPC ............ 438/477; 257/E21.321; 257/E21.324; 438/402; 438/471; 438/509; 438/795; 438/799

(58) Field of Classification Search
USPC ........... 257/E21.321, E21.324; 438/402, 471, 438/477, 509, 795, 799
See application file for complete search history.

(56) References Cited

U.S. PATENT DOCUMENTS

| | | | |
|---|---|---|---|
| 2002/0179006 A1* | 12/2002 | Borgini et al. | 117/95 |
| 2007/0169688 A1 | 7/2007 | Yoon et al. | |
| 2011/0227202 A1* | 9/2011 | Park | 257/618 |

OTHER PUBLICATIONS

Tony Stephens, "Tutorial on Silicon Defect Etch Analysis of Finished Wafers for Furnace Slip", Silicon Engineering Technology Center, Jun. 8, 1999.

* cited by examiner

*Primary Examiner* — Asok K Sarkar
(74) *Attorney, Agent, or Firm* — Jacqueline J. Garner; Wade J. Brady, III; Frederick J. Telecky, Jr.

(57) ABSTRACT

A method for fabricating an integrated circuit (IC) includes initial oxidizing of a semiconductor surface of a substrate. The substrate is heated after the initial oxidizing using a plurality of furnace processing steps which each include a peak processing temperature between 800° C. and 1300° C. The furnace processing steps include at least one accelerated processing step having an accelerated ramp portion in a temperature range between 800° C. and 1250° C. providing an accelerated ramp-up rate and/or an |accelerated ramp-down rate| of at least ($\geq$) 5.5° C./min.

17 Claims, 6 Drawing Sheets

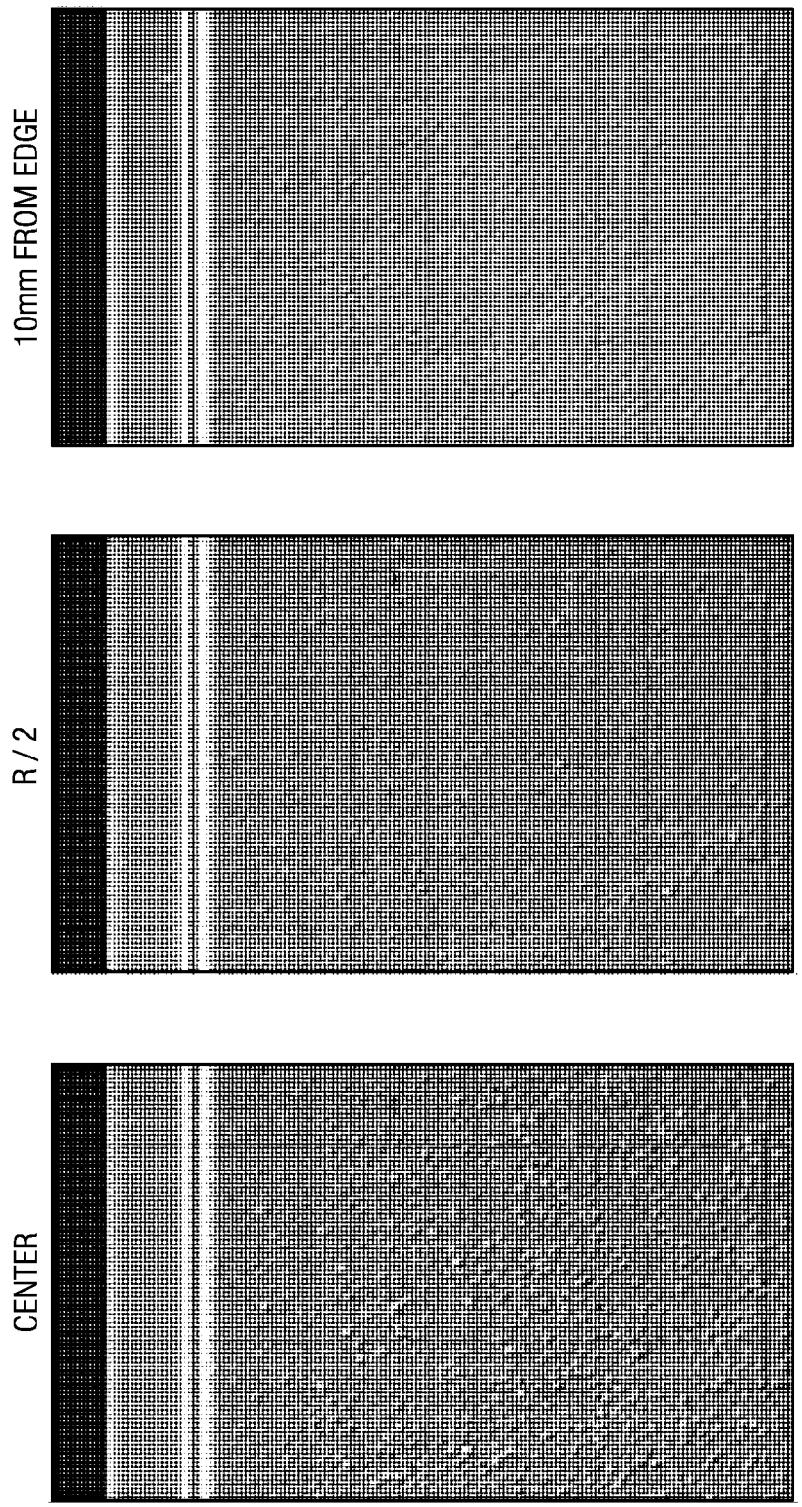

US 8,759,198 B2

ACCELERATED FURNACE RAMP RATES FOR REDUCED SLIP

FIELD

Disclosed embodiments relate to integrated circuit (IC) manufacturing, more particularly to furnace processing during the IC manufacturing process.

BACKGROUND

Bulk micro-defects (BMDs) are intentionally formed within the substrate (e.g., wafers, such as silicon wafers) away from the active areas where transistors are formed to implement intrinsic gettering (IG) in substrates to reduce device leakage and associated device failures. BMD utilizes oxygen precipitation and bulk or oxidation stacking faults. In IG substrates, metallic impurities that would otherwise be at the substrate surface, and thus at or near pn junctions, can be substantially eliminated by gettering provided by the BMD which absorbs these impurities at positions at which device characteristics are not directly influenced by the BMD. It is thus possible to reduce the device failure caused by the generation of crystalline defects and the increase of pn junction leakage current due to metallic contamination, for instance.

Semiconductor processing, such as for forming analog ICs, generally requires high temperature furnace processing and Rapid Thermal Processing (RTP) at temperatures up to about 1250° C. High temperature processing on any size wafer is a challenge for minimizing thermally induced crystalline slip and resulting dislocations, but is a greater challenge as the wafer diameter increases to ≥200 mm, such as 300 mm. The most common dislocation-induced failure mechanism is device leakage. Conventionally, furnace ramp-up and ramp-down rates are slowed in medium/high temperature furnace processing (e.g., 800 to 1150° C.) to minimize slip.

SUMMARY

Disclosed embodiments recognize excessive time at temperature during the many medium/high temperature furnace processing steps involved in IC fabrication through bulk micro defect (BMD) growth temperatures (e.g., 800 to 1150° C.) can lead to excessive precipitation making the substrate (e.g. wafer) mechanically weaker and leading to more slip. By accelerating ramp rates both pre/post peak process temperature for furnace processing the Inventors have discovered significantly reduces slip, believed to be due to reduced time at temperatures when BMD are likely to form and grow. Particularly for analog ICs on larger diameter substrates (e.g., wafers) with longer total thermal budgets, such as >3,000 minutes>600° C., it has been discovered accelerated ramp rates significantly reduce total slip. This discovery is directly opposite to conventional historical IC processing knowledge which consistently teaches slowing the furnace ramp-up and ramp-down rates will reduce thermal gradients across the wafer, which reduces slip and resulting dislocation density.

BRIEF DESCRIPTION OF THE DRAWINGS

Reference will now be made to the accompanying drawings, which are not necessarily drawn to scale, wherein:

FIG. 4A shows scanned images revealing slip data obtained using Scanning Infrared Depolarization (SIRD) from 300 mm bulk silicon wafers after 1200° C. diffusion with conventional slow ramp rates, while

FIGS. 6A-F show scanned photographs providing a BMD comparison, obtained post epitaxial deposition after an etch that delineated defects on the silicon substrate surface followed by an interference contrast microscope. FIGS. 6A-C show post-epi scanned photograph readings from the center, r/2 and 10 mm from the edge of the wafer following disclosed accelerated ramp rate furnace processing, and FIGS. 6D-F show scanned photograph post-epi readings from the center, r/2 and 10 mm from the edge of the wafer following conventional slow ramp furnace anneals.

DETAILED DESCRIPTION

Figure 1:
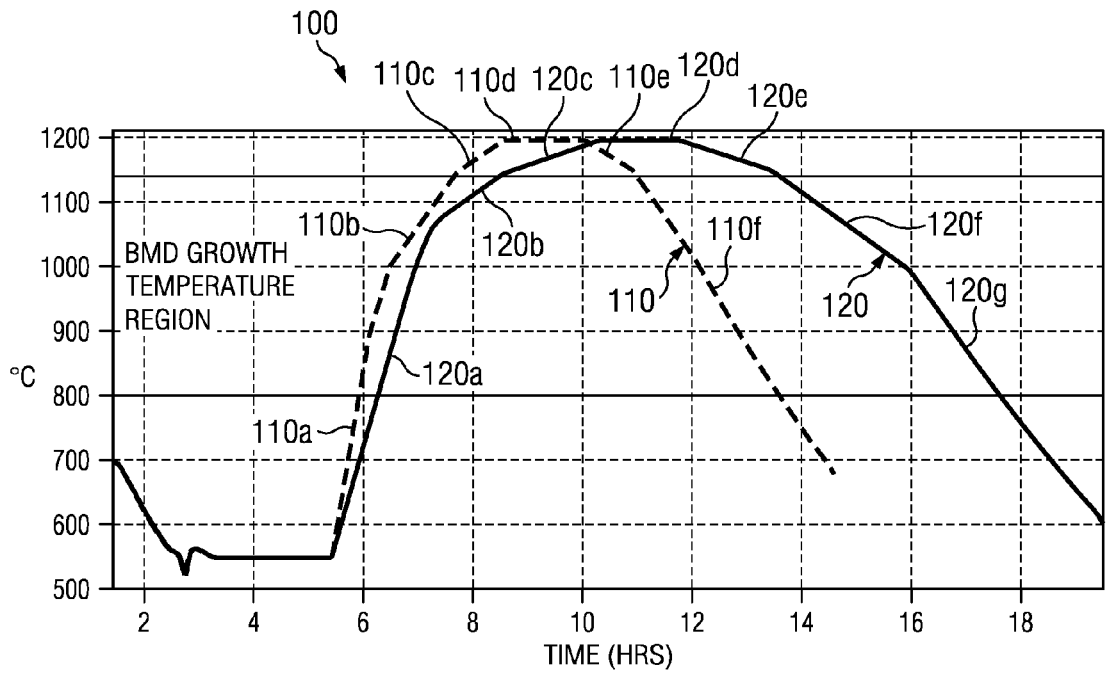
FIG. 1 is a time temperature graph for an example accelerated ramp rate furnace heat treatment process according to an example embodiment as compared to a conventional slow ramp rate furnace heat treatment process.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a time temperature graph 100 for an example accelerated ramp rate furnace heat treatment process 110 according to an example embodiment as compared to a conventional slow ramp rate furnace heat treatment process 120, for a 1200° C. diffusion process. As used herein, a "furnace" used for disclosed "furnace processing steps" is defined to have its conventional meaning, that being a long tube heated over a large process zone (>0.5 m) that accommodates multiple semiconductor wafers (one or more lots) at a time, where the total process time from loading to unloading is generally at least 0.5 hrs, and that attainable temperature ramp rate is generally <20° C./min (although some fast ramp furnaces can achieve significantly faster ramp rates). Furnace processing may be distinguished from Rapid Thermal Processing (or RTP) which refers to a semiconductor manufacturing process which heats single wafers to high temperatures (up to 1,050° C. or greater) on a timescale of several minutes or less, where the rapid heating rates are often attained by high intensity lamps or lasers.

The approximate temperature zone for bulk micro-defects (BMD) is shown between 800 and 1140° C. For the disclosed accelerated heat treatment process 110, the ramp-up includes ramp-up portions 110a, 110b, 110c. The ramp rate in ramp-up portions 110a, 110b, 110c are 8° C./min, 4° C./min, and 2 to 3° C./min, respectively. Portion 110d is the peak temperature portion, shown as being about 1200° C. The ramp-down for heat treatment process 110 includes ramp-down portions 110e, and 110f. The ramp-down rate in portions 110e, and 110f are 2° C./min and 2.5° C./min, respectively. The 110f ramp-down rate could have been faster, but the capability of the furnace type used was limited to a maximum of 2.5° C./min for ramp-down.

For conventional heat treatment process 120, the ramp-up includes ramp-up portions 120a, 120b, 120c. The ramp-up rate in portions 120a, 120b, 120c are 5° C./min, 2° C./min, and 1° C./min, respectively. Portion 120d is the peak temperature portion, shown as being about 1200° C. The ramp-down for heat treatment process 120 includes ramp-down portions 120e, and 120f. The ramp-down rate in portions 120e, 120f and 120g are 1° C./min, 2.0° C./min, and 2.5° C./min, respectively.

Figure 4B:
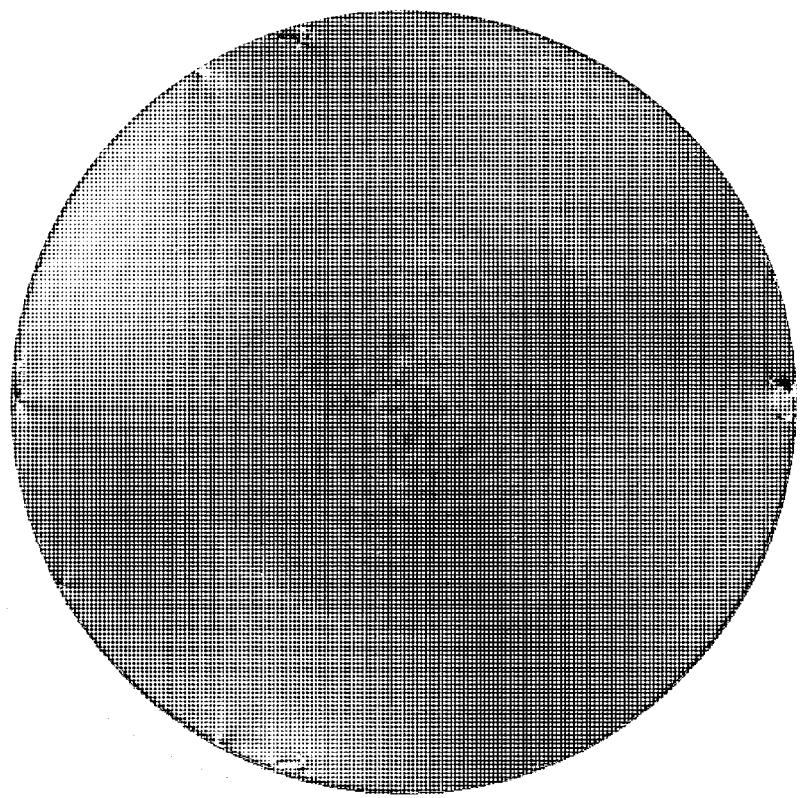
FIG. 4B shows scanned slip data obtained using SIRD for 300 mm wafer after 1200° C. diffusion with disclosed accelerated furnace high temp ramp rate. The lighter contrast in FIG. 4B compared to FIG. 4A indicates significantly fewer/smaller BMDs.
Figure 4A:
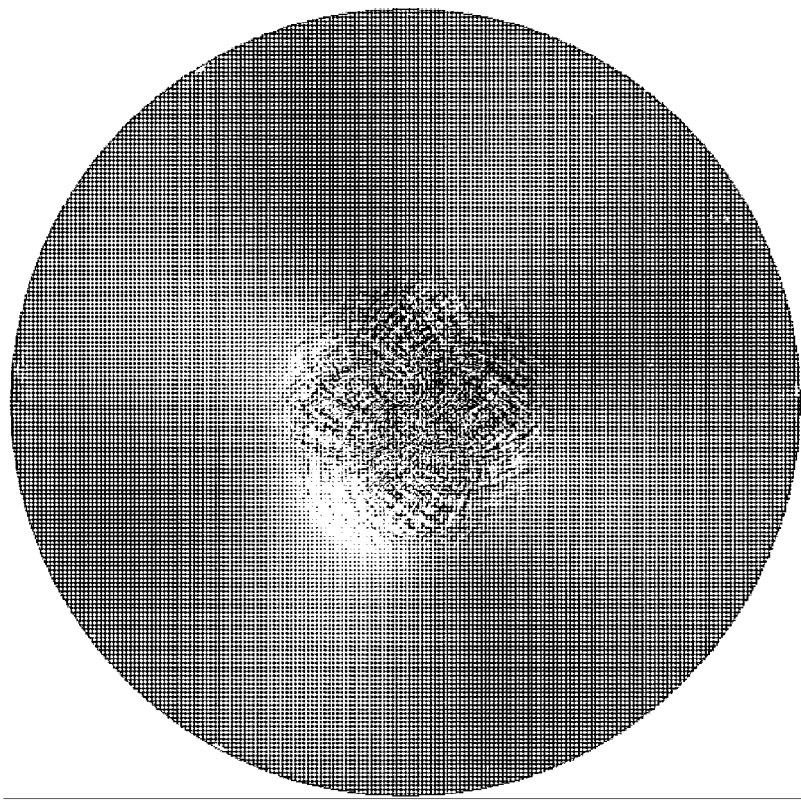

Accelerated heat treatment process 110 accelerating the ramp rates through the BMD growth temperatures as compared to conventional slow ramp rate furnace heat treatment process 120 has been found to improve wafer strength for improved slip resistance as described below relative to FIGS. 4A and 4B and reduce wafer bow described below relative to FIG. 5. Shorter time spent during BMD growth temperature cycles has also been unexpectedly found to reduce BMD size/count described below relative to FIGS. 6A-F.

Figure 2:
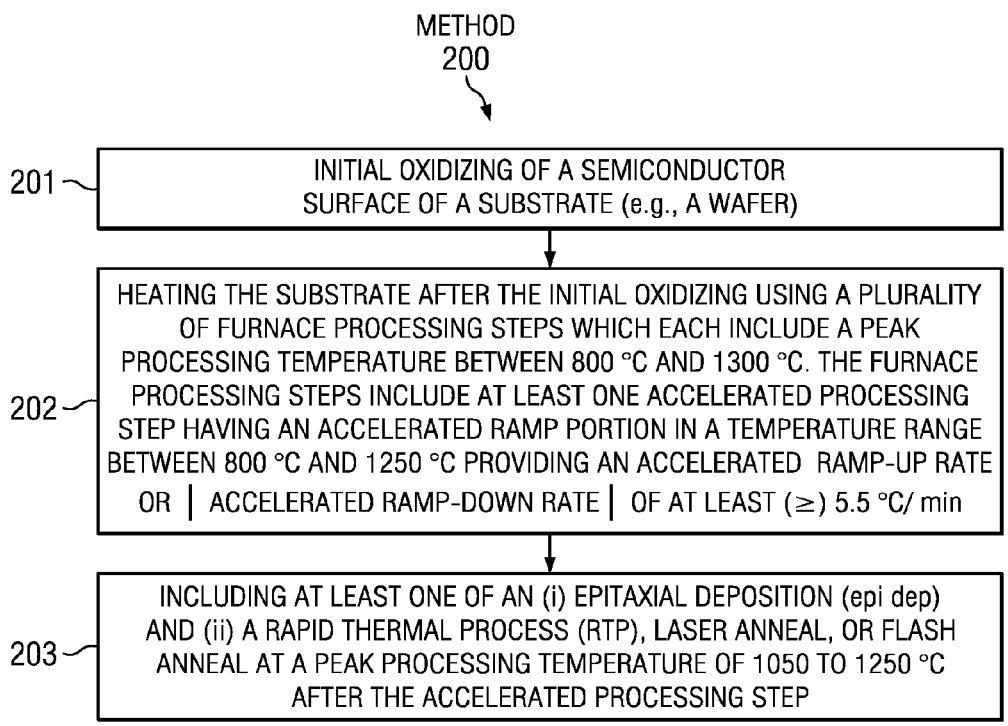
FIG. 2 is a flow chart that shows steps in an example method of fabricating an IC including accelerated furnace ramp rates for improved slip performance, according to an example embodiment.

FIG. 2 is a flow chart that shows steps in an example method 200 for fabricating an IC including accelerated furnace ramp rates for improved slip performance, according to an example embodiment. Step 201 comprises initial oxidizing of a semiconductor surface of a substrate (e.g., a wafer). The substrate can have a diameter of at least (≥) 200 mm, such as 300 mm. In various embodiments, the substrate can comprise silicon, silicon-germanium, or other substrate that provides a semiconductor surface. In one embodiment the substrate comprises a p− substrate having a boron doping concentration between $1\times10^{14}$ cm$^{-3}$ to $1\times10^{16}$ cm$^{-3}$, or a p+ substrate having a boron doping concentration between $1\times10^{17}$ cm$^3$ to $1\times10^{19}$ cm$^{-3}$.

Step 202 comprises heating the substrate after the initial oxidation using a plurality of furnace processing steps which each include a peak processing temperature between 800° C. and 1300° C. The furnace processing includes at least one accelerated processing step having a temperature ramp portion in a range between 800° C. and 1250° C. providing an accelerated ramp-up rate or |accelerated ramp-down rate| of at least (≥) 5.5° C./min. The accelerated ramp can include both an accelerated ramp-up portion and/or an accelerated ramp-down portion providing an accelerated ramp-up rate and |accelerated ramp-down rate| of at least (≥) 5.5° C./min. In one embodiment the accelerated ramp portion provides a ramp-up rate and/or |accelerated ramp-down rate| between 6° C./min and 11° C./min. The accelerated processing step can include flowing at least one of nitrogen, oxygen, and steam.

Step 203 comprises including at least one of an (i) epitaxial deposition (epi dep) and (ii) a rapid thermal process (RTP), laser anneal, or flash anneal at a peak processing temperature of 1050 to 1300° C., after the accelerated processing step. Epi dep and RTP, laser anneal and flash anneal are not disclosed accelerated processing steps, but can benefit from disclosed accelerated processing steps used beforehand.

In one embodiment the accelerated ramp portion comprises both an accelerated ramp-up portion and an accelerated ramp-down portion both providing an accelerated ramp-up rate and |accelerated ramp-down rate| of at least (≥) 5.5° C./min, wherein a total thermal budget for the method above (>) 600° C. is greater than 3,000 minutes, and the accelerated processing step includes at least a first moderated ramp rate portion in a temperature range above a temperature range of the accelerated ramp-up portion having a ramp rate below the accelerated ramp-up rate, and least a second moderated ramp rate portion in a temperature range above a temperature range of the accelerated ramp-down portion having a ramp rate below the |accelerated ramp-down rate|. This embodiment implements graduated ramp rates, with the fastest ramp portions at lower temperatures. The example heat treatment process 110 shown in FIG. 1 implements graduated ramp rates in both the ramp-up and ramp-down, with the ramp-up rate in portion 110c<portion 110b<portion 110a, and the ramp-down rate in portion 110e<portion 110f.

Disclosed embodiments may be used for a variety of processes including advanced analog processes with long process flows, such as linear BiCMOS. Moreover, standard CMOS processes can benefit where BMD growth can cause problems, particularly for CMOS technologies including laser/flash anneal processing.

EXAMPLES

Disclosed embodiments are further illustrated by the following specific Examples, which should not be construed as limiting the scope or content of this Disclosure in any way.

Figure 3:
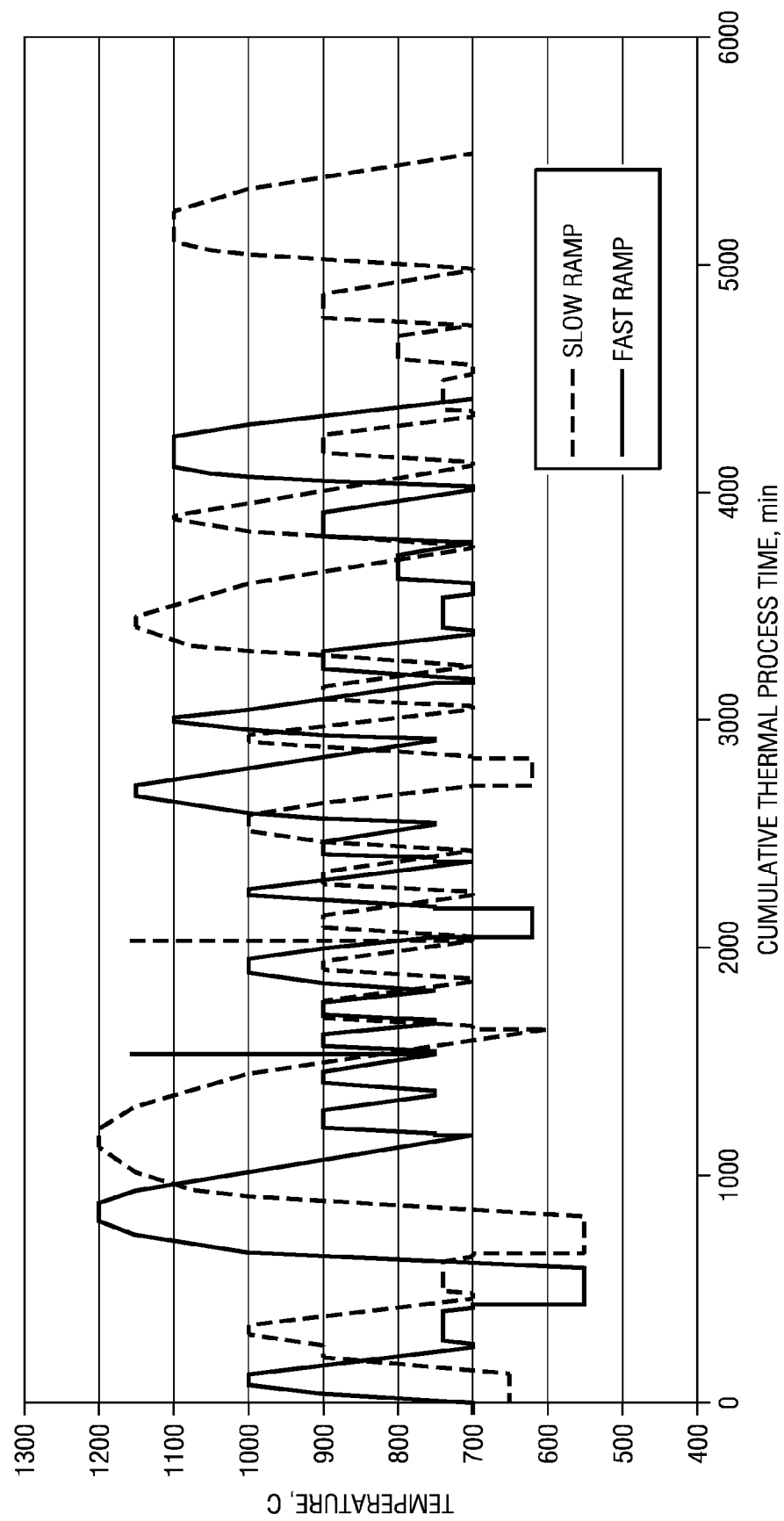
FIG. 3 provides a total thermal budget (shown as cumulative thermal process time) comparison for example thermal processing steps for an analog CMOS semiconductor polysilicon gate process using conventional slow ramp furnace processing as compared to the same process using disclosed accelerated furnace ramp rate furnace processing.

FIG. 3 provides a total thermal budget comparison for the example thermal processing steps for an analog CMOS semiconductor polysilicon gate process using conventional slow ramp furnace processing having a total duration of about 5,500 minutes at ≥600° C. marked as "slow ramp". "Slow ramp", is the control process that is compared to the otherwise same process run using disclosed accelerated furnace ramp rate furnace processing marked as "fast ramp". The complete semiconductor process flow using disclosed accelerated ramp rate furnace processing tested has a total duration of about 4,500 minutes at ≥600° C., thus providing a significant reduction of about 1,000 minutes at ≥600° C. (and a cycle time reduction).

By accelerating the ramp rates in medium/high temperature furnace processing (≥600° C.), slip data obtained confirmed slip was found to be significantly reduced following both 1200° C. diffusion ("High Temp Diffusion" above) and 1160° C. epi ("epi-dep" above). For example, FIG. 4A shows scanned slip data obtained using SIRD from 300 mm bulk silicon wafers, after 1200° C. high temp diffusion with conventional slow ramp rates. FIG. 4B shows scanned slip data obtained using SIRD for 300 mm wafer after 1200° C. diffusion ("High Temp Diffusion") with disclosed accelerated furnace ramp rate high temp, no center deformation/slip. The lighter contrast in FIG. 4B compared to FIG. 4A evidences significantly fewer/smaller BMDs.

Figure 5:
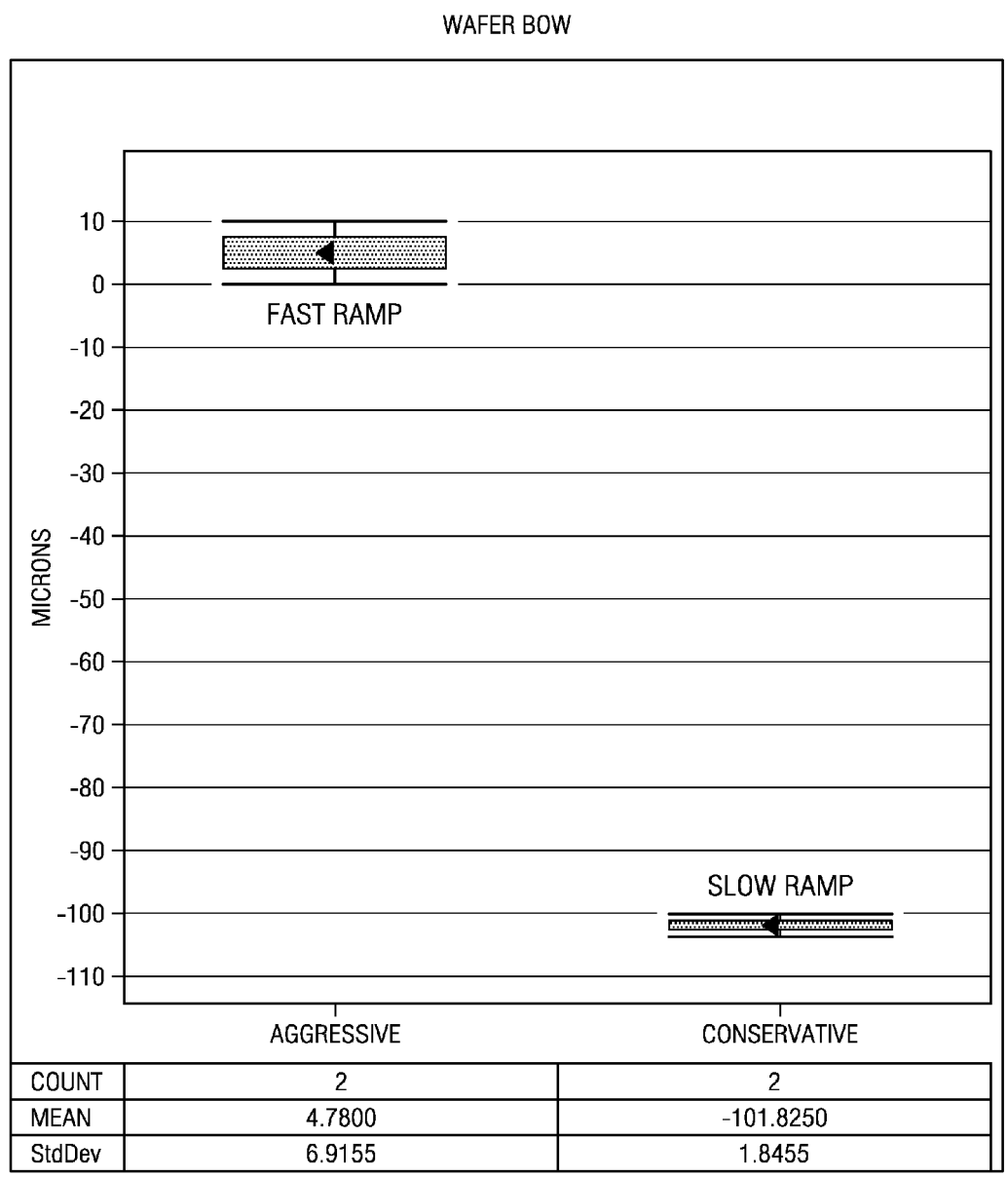
FIG. 5 provides wafer bow data showing the measured bow for a 300 mm bulk silicon wafer for a 1200° C. diffusion process after a disclosed accelerated furnace ramp rate diffusion (shown as "fast ramp") is significantly reduced as compared to after a control conventional slow ramp rate diffusion (shown as "slow ramp").

FIG. 5 provides wafer bow data showing the measured bow for a 300 mm bulk silicon wafer for a 1200° C. diffusion ("High Temp Diffusion") after a disclosed accelerated furnace ramp rate process (shown as "fast ramp") is significantly reduced as compared to after a control conventional slow ramp rate process (shown as "slow ramp"). The disclosed accelerated furnace ramp rate process resulted in a bow of 2 to 8 microns, while the slow ramp rate process resulted in a bow of about −102 to −104 microns.

Figures 6D, 6E, 6F:
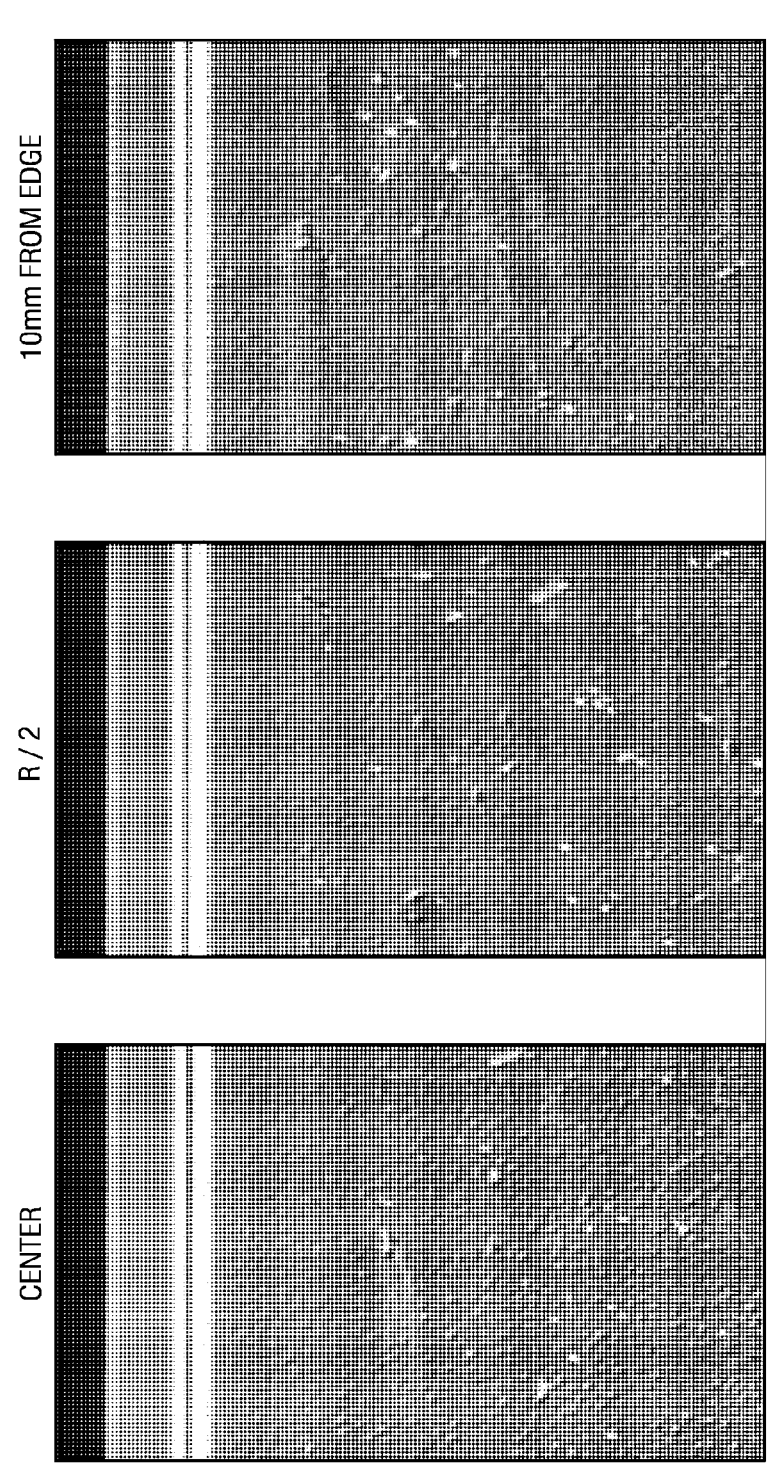

FIGS. 6A-F show scanned photographs of a BMD comparison (cross section of wafer), obtained post epitaxial deposition (1100° C. epi or above) after an etch that delineated defects on the silicon substrate surface followed by an interference contrast microscope used to inspect the wafer for the etch-delineated defects. FIGS. 6A-C showing post-epi scanned photograph readings from the center, r/2 and 10 mm from the edge of the wafer following disclosed accelerated ramp rate furnace processing (shown as "Fast Ramp"), while FIGS. 6D-F provides scanned photograph post-epi readings from the center, r/2 and 10 mm from the edge of the wafer following conventional slow ramp furnace anneals (shown as "Slow Ramp"). The DMD is expressed per unit area ($cm^2$), and DZ corresponds to denuded zone depth in microns. The large white spots in the scanned photographs are BMDs, with significantly higher counts and larger size on the slow ramp processed sample.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method for fabricating an integrated circuit (IC), comprising:
    initial oxidizing of a semiconductor surface of a substrate;
    heating said substrate after said initial oxidizing using a plurality of furnace processing steps which each include a peak processing temperature between 800° C. and 1300° C.; said furnace processing steps including:
        at least one accelerated processing step having an accelerated ramp portion in a temperature range between 800° C. and 1250° C. providing an accelerated ramp-up rate or |accelerated ramp-down rate| of at least (≥) 5.5° C./min; and
    performing at least one of (i) an epitaxial deposition and (ii) a rapid thermal process (RTP), laser anneal, and flash anneal at a peak processing temperature of 1050 to 1300° C.;
    wherein said accelerated ramp portion comprises both an accelerated ramp-up portion and an accelerated ramp-down portion both providing said accelerated ramp-up rate or said |accelerated ramp-down rate| of at least (≥) 5.5° C./min,
    wherein a total thermal budget for said method above (>) 600° C. is greater than 3,000 minutes, and
    wherein said accelerated processing step includes at least a first moderated ramp rate portion in a temperature range above a temperature range of said accelerated ramp-up portion having a ramp rate below said accelerated ramp-up rate, and least a second moderated ramp rate portion in a temperature range above a temperature range of said accelerated ramp-down portion having a ramp rate below said |accelerated ramp-down rate|.

2. The method of claim 1, wherein said accelerated ramp portion provides said ramp-up rate or said |accelerated ramp-down rate| between 6° C./min and 11° C./min.

3. The method of claim 1, wherein said accelerated processing step includes flowing at least one of nitrogen, oxygen, and steam.

4. The method of claim 1, wherein said method includes both said (i) and said (ii).

5. The method of claim 1, wherein said substrate comprises silicon and said accelerated processing step comprises a plurality of said accelerated processing steps.

6. The method of claim 1, wherein said substrate has a diameter of at least (≥) 200 mm.

7. The method of claim 1, wherein said substrate comprises a p− substrate having a boron doping concentration between $1 \times 10^{14}$ $cm^{-3}$ and $1 \times 10^{16}$ $cm^{-3}$.

8. The method of claim 1, wherein said substrate comprises a p+ substrate having a boron doping concentration between $1 \times 10^{17}$ $cm^{-3}$ and $1 \times 10^{19}$ $cm^{-3}$.

9. A method for fabricating an integrated circuit (IC), comprising:
    initial oxidizing of a silicon surface of a substrate;
    heating said substrate after said initial oxidizing using a plurality of furnace processing steps which each include a peak processing temperature between 800° C. and 1300° C.; said furnace processing steps including:
    a plurality of accelerated processing step having an accelerated ramp portion in a temperature range between 800° C. and 1250° C. providing both an accelerated ramp-up rate and |accelerated ramp-down rate| of between 6° C./min and 11° C./min;
    wherein at least some of said plurality of accelerated processing steps include at least a first moderated ramp rate portion in a temperature range above a temperature range of said accelerated ramp-up portion having a ramp rate below said accelerated ramp-up rate, and least a second moderated ramp rate portion in a temperature range above a temperature range of said accelerated ramp-down portion having a ramp rate below said |accelerated ramp-down rate|,
    wherein said method further comprises an epitaxial deposition and at least one of a rapid thermal process (RTP), laser anneal, and flash anneal at a peak processing temperature of 1050 to 1300; and
    wherein a total thermal budget for said method above (>) 600° C. is greater than 3,000 minutes.

10. The method of claim 9, wherein said substrate has a diameter of at least (≥) 200 mm.

11. The method of claim 9, wherein said method further comprises at least one of (i) an epitaxial deposition and (ii) at least one of a rapid thermal process (RTP), laser anneal, and flash anneal at a peak processing temperature of 1050 to 1300° C.

12. The method of claim 11, wherein said method includes both said (i) and said (ii).

13. A method for fabricating an integrated circuit (IC), comprising:
    initial oxidizing of a semiconductor surface of a substrate;
    heating said substrate after said initial oxidizing using a plurality of furnace processing steps which each include a peak processing temperature between 800° C. and 1300° C.; said furnace processing steps including:
        at least one accelerated processing step having an accelerated ramp portion in a temperature range between 800° C. and 1250° C. providing an accelerated ramp-up rate of at least (≥) 5.5° C./min; and at least a first moderated ramp rate portion in a temperature range above a temperature range of said accelerated ramp-up portion having a ramp-up rate below said accelerated ramp-up rate.

14. The method of claim 13, wherein said accelerated ramp-up rate is between 6° C./min and 11° C./min.

15. The method of claim 13, wherein said accelerated processing step includes flowing at least one of nitrogen, oxygen, and steam.

16. The method of claim 13, wherein said method further comprises at least one of (i) an epitaxial deposition and (ii) a rapid thermal process (RTP), laser anneal, and flash anneal at a peak processing temperature of 1050 to 1300° C.

17. The method of claim 16, wherein said method includes both said (i) and said (ii).

* * * * *